(12) United States Patent
Chien et al.

(10) Patent No.: US 10,880,992 B2
(45) Date of Patent: Dec. 29, 2020

(54) CIRCUIT BOARD STRUCTURE

(71) Applicant: Advanced Connectek Inc., New Taipei (TW)

(72) Inventors: Min-Lung Chien, New Taipei (TW); Mao-Sheng Chen, New Taipei (TW); Wen-Yu Wang, New Taipei (TW)

(73) Assignee: Advanced Connectek Inc., New Taipei (TW)

( * ) Notice: Subject to any disclaimer, the term of this patent is extended or adjusted under 35 U.S.C. 154(b) by 0 days.

(21) Appl. No.: 16/522,669

(22) Filed: Jul. 26, 2019

(65) Prior Publication Data
US 2020/0037440 A1 Jan. 30, 2020

(30) Foreign Application Priority Data
Jul. 26, 2018 (TW) .............................. 107210179 U

(51) Int. Cl.
*H05K 1/11* (2006.01)
*H05K 1/02* (2006.01)

(52) U.S. Cl.
CPC ......... *H05K 1/0245* (2013.01); *H05K 1/0219* (2013.01); *H05K 1/0228* (2013.01); *H05K 1/115* (2013.01); *H05K 1/116* (2013.01); *H05K 2201/09227* (2013.01); *H05K 2201/10189* (2013.01)

(58) Field of Classification Search
CPC .......... H05K 1/11; H05K 1/111; H05K 1/112; H05K 1/113; H05K 1/114; H05K 1/115; H05K 1/116
USPC ........................... 174/262–266; 361/792–795
See application file for complete search history.

(56) References Cited

U.S. PATENT DOCUMENTS

| | | | |
|---|---|---|---|
| 7,209,368 B2 * | 4/2007 | Lauffer | H01L 23/5383 174/252 |
| 7,609,125 B2 * | 10/2009 | van Quach | H01L 23/66 333/238 |
| 9,178,297 B2 | 11/2015 | Kodaira et al. | |
| 9,949,360 B2 * | 4/2018 | Chen | H05K 1/0219 |
| 2003/0188889 A1 * | 10/2003 | Straub | H05K 1/0219 174/262 |

\* cited by examiner

*Primary Examiner* — Jeremy C Norris
(74) *Attorney, Agent, or Firm* — JCIPRNET

(57) ABSTRACT

A circuit board structure including a dielectric substrate having a plurality of vias, a first conductor layer, a second conductor layer, an insulating layer, and a third conductor layer. The first and the second conductor layers are disposed at opposite surfaces of the dielectric substrate. The first conductor layer forms a plurality of traces including at least one high-speed differential pair and a plurality of ground traces, wherein the vias are located on the ground traces. The electric insulated layer is disposed on the dielectric substrate and covers the first conductor layer, and the third conductor layer is disposed on the insulating layer.

7 Claims, 3 Drawing Sheets

CIRCUIT BOARD STRUCTURE

CROSS-REFERENCE TO RELATED APPLICATION

This application claims the priority benefit of Taiwan patent application serial no. 107210179, filed on Jul. 26, 2018. The entirety of the above-mentioned patent application is hereby incorporated by reference herein and made a part of the specification.

BACKGROUND

Field of the Disclosure

The disclosure is related to a circuit board structure.

Description of Related Art

Typical multi-layer circuit board structure is used at an operation frequency lower than 1 GHz. However, along with increased amount of data that is processed through electronic machinery, miniaturization and integration of system are developed to enhance data processing capability, thus developing electronic products capable of processing data at super speed. For such electronic products that perform transmission at super speed, the quality of its multi-layer printed circuit board plays an important role; in particular, the wiring method thereof significantly affects the stability of signal transmission. However, due to limitation of material and structure as well as limitation of electromagnetic wave interference (EMI), radio frequency interference (RFI) and impedance requirement, the wiring layout and transmitting performance of circuit board are affected.

Especially when it comes to super speed or high frequency, the effects caused by EMI and RFI as well as other noises are increasingly severe. In view of the above, it is an issue for practitioners of the field to find out how to meet the expectation of miniaturization, high density wiring, high multi-layer configuration and high frequency correspondence (with low transmission loss) with currently available materials and structures.

SUMMARY

The disclosure provides a circuit board structure, capable of improving transmission efficiency in high-speed transmission.

A circuit board structure of the disclosure includes a dielectric substrate, a first conductor layer, a second conductor layer, an insulating layer and a third conductor layer. The dielectric substrate has a plurality of vias. The first conductor layer and the second conductor layer are respectively disposed on two opposite surfaces of the dielectric substrate, wherein the first conductor layer forms a plurality of traces. The traces include at least one pair of signal traces and a plurality of ground traces, and the vias are located on the ground traces. The insulating layer is disposed on the first conductor layer, and the third conductor layer is disposed on the insulating layer.

According to an embodiment of the disclosure, the at least one pair of signal traces constitutes a high-speed differential pair trace, the high-speed differential pair trace is located between the ground traces and closely adjacent to each other.

According to an embodiment of the disclosure, the traces include a plurality of pair of signals traces, the plurality of pair of signal traces constitute a plurality of high-speed differential pair traces ($S_{1a}/S_{1b}$, $S_{2a}/S_{2b}$, ... ), and the high-speed differential pair traces and the ground traces ($G_1$, $G_2$, $G_3$, ... ) and arranged in an interval sequence ($G_1S_{1a}S_{1b}G_2S_{2a}S_{2b}G_3$ ... ).

An embodiment of the disclosure further includes a plurality of four conductor layers disposed on an inner wall of the vias. The ground traces electrically conducts the second conductor layer through the fourth conductor layer.

An embodiment of the disclosure further includes a pair of connectors. The traces are electrically connected between the pair of connectors.

According to an embodiment of the disclosure, the traces comprise a plurality of pair of signal traces, and each pair of signal traces is connected between the pair of connectors through the shortest path between the pair of connectors.

According to an embodiment of the disclosure, the trace further includes at least one non-high-speed differential pair trace electrically connected between the connectors.

According to an embodiment of the disclosure, on the same ground trace, a distance between the adjacent vias is smaller than or equal to 4 mm.

According to an embodiment of the disclosure, in the pair of signal traces which are a high-speed differential pair trace, a trace width of each of the high-speed differential pair traces is larger than or equal to 3.5 mil.

According to an embodiment of the disclosure, a thickness of the dielectric substrate is larger than or equal to 3 mil, and a thickness of the insulating layer is larger than or equal to 3 mil.

Based on the above, in the embodiments of the disclosure, the circuit board structure is disposed on the upper and lower sides of the first conductor layer through the second conductor layer and the third conductor layer. Meanwhile, the distance between the third conductor layer and the first conductor layer is increased due to the thickness of the insulating layer, thereby providing a sufficient shielding effect to the first conductor layer formed with traces, such that signal interference can be avoided and transmission efficiency can be enhanced.

In order to make the aforementioned features and advantages of the disclosure more comprehensible, embodiments accompanying figures are described in detail below.

DESCRIPTION OF EMBODIMENTS

Figure 1:
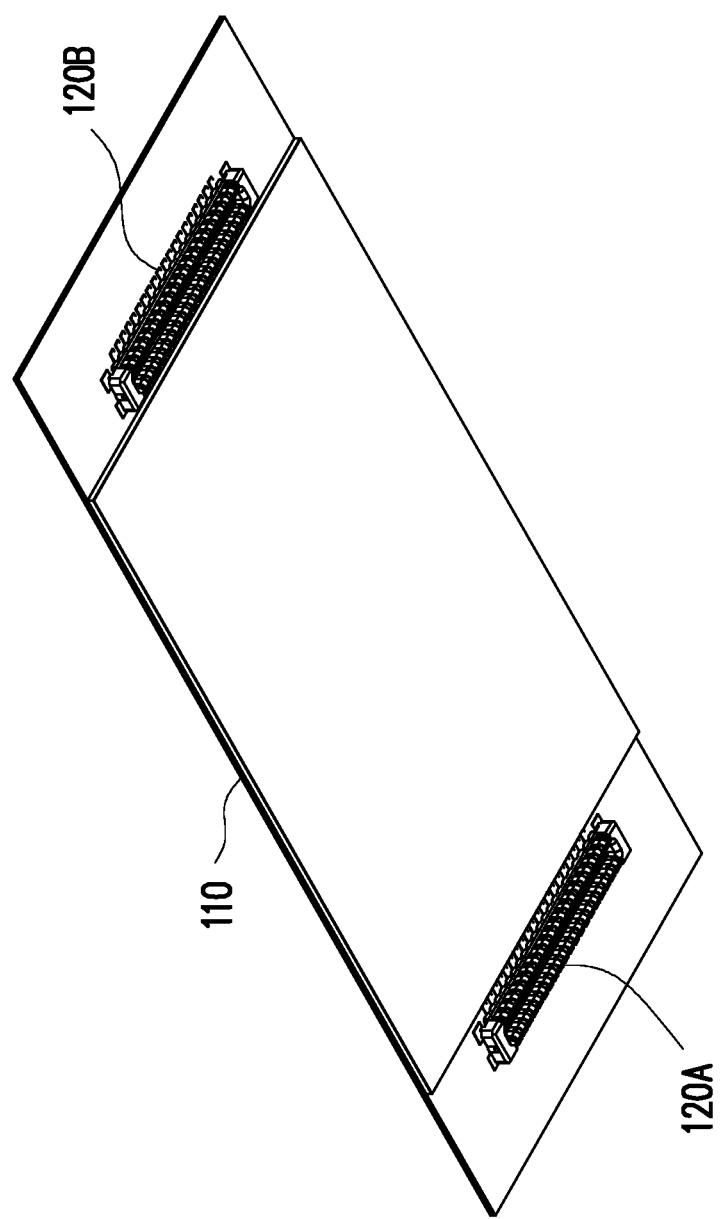
FIG. 1 is a schematic view of a circuit board structure according to an embodiment of the disclosure.
Figure 2:
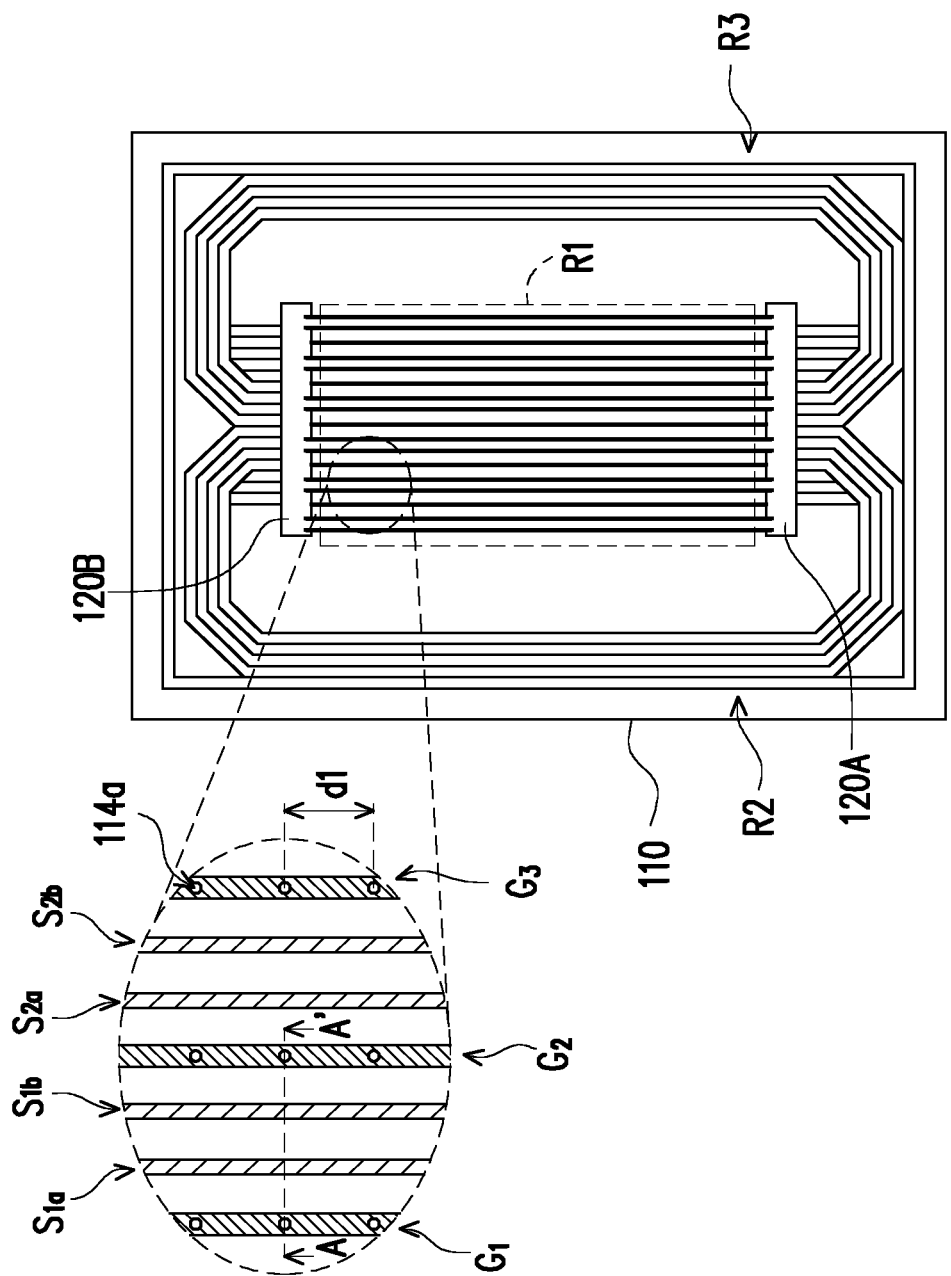
FIG. 2 is a top view of the circuit board structure depicted in FIG. 1.

FIG. 1 is a schematic view of a circuit board structure according to an embodiment of the disclosure. FIG. 2 is a top view of the circuit board structure depicted in FIG. 1. Referring to FIG. 1 and FIG. 2, in the embodiment, a circuit board structure 100 includes a connecting portion 110 and a pair of connectors 120A and 120B, wherein the connecting portion 110 is provided with a plurality of traces R1, R2 and R3, and the traces R1, R2 and R3 are electrically connected between the connectors 120A and 120B, such that it is convenient for user to electrically connect two different electronic devices (not shown) through the circuit board structure 100. Herein, the circuit board structure 100 is, for example, a flexible printed circuit (FPC), that is, the connectors 120A and 120B are disposed on the flexible connecting portion 110 to serve as an electrical connection interface between different electronic devices. It should be mentioned that, in another embodiment that is not shown, the circuit board structure may be a rigid printed circuit board (PCB) which can equally achieve the same effect as the present embodiment.

Herein, the connectors 120A and 120B are, for example, board to board connectors; therefore, the user can use the circuit board structure 100 as the electrical connection structure interface between different circuit boards (i.e., the two electronic devices mentioned above). In another embodiment that is not shown, the connectors 120A and 120B may be a connector with other specification such as a Type-C USB connector.

Figure 3:
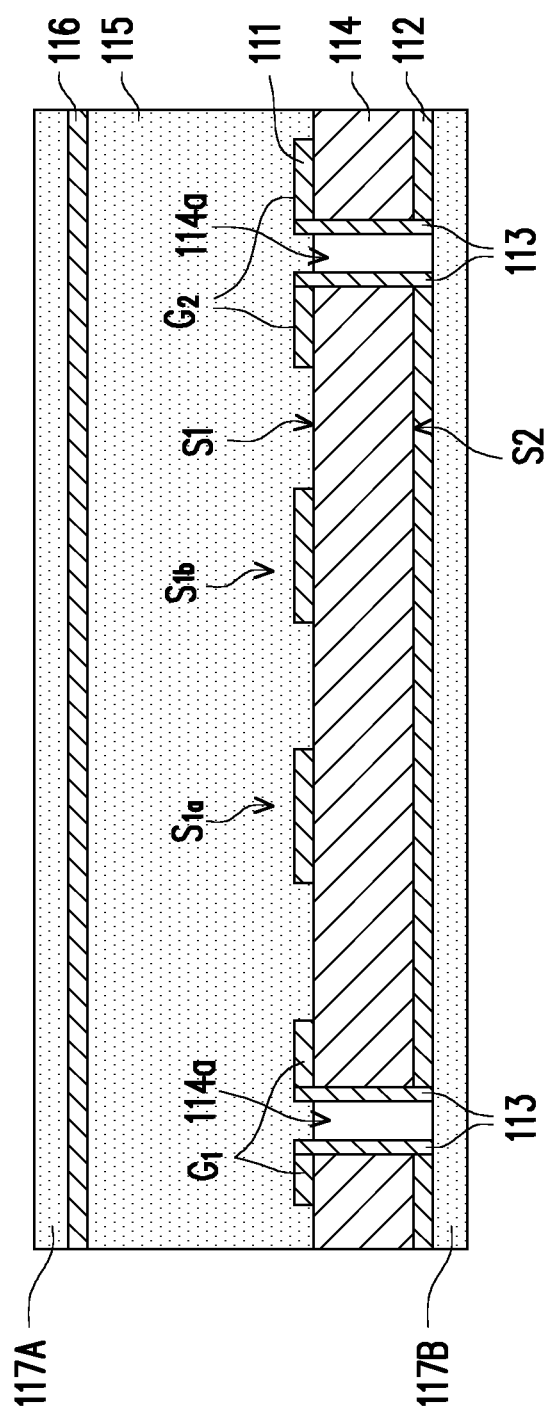
FIG. 3 is a partial cross-sectional view of the circuit board structure depicted in FIG. 2.

FIG. 3 is a partial cross-sectional view of the circuit board structure depicted in FIG. 2, which is illustrated along sectional line A-A'. Referring to FIG. 2 and FIG. 3, in the embodiment, the layer structure of the circuit board structure 100 in the connecting portion 110 substantially includes a dielectric substrate 114, a first conductor layer 111, a second conductor layer 112, an insulating layer 115 and a third conductor layer 116, wherein the dielectric substrate 114 has two surfaces S1 and S2 opposite to each other. The first conductor layer 111 is disposed on the surface S1, the second conductor layer 112 is disposed on the surface S2, the insulating layer 115 is disposed on the surface S1 and covers the first conductor layer 111, and the third conductor layer 116 is disposed on the insulating layer 115 and located on the opposite side of the first conductor layer 111 to keep a distance from the first conductor layer 111. Further, the first conductor layer 111 forms the plurality of traces R1, R2 and R3 electrically connected between the connectors 120A and 120B. In this manner, the traces R1, R2 and R3 form a stripline structure. Also, through the configuration that the second conductor layer 112 and the third conductor layer 116 are disposed on the upper and lower sides of the first conductor layer 111, a better shielding effect is provided for the plurality of traces R1, R2 and R3 therebetween, thereby effectively reducing EMI or RFI.

Additionally, the circuit board structure 100 of the embodiment further includes an insulating layer 117A and 117B respectively disposed on the third conductor layer 116 and the second conductor layer 112 to respectively provide insulating protection effect thereto.

As described above, in order to reduce or even avoid attenuation or insertion loss of circuit board structure 100 in high-speed transmission, other than the shielding effect brought by the second conductor layer 112 and the third conductor layer 116, the circuit board structure 100 in the embodiment also archives the required shielding effect through wiring layout.

Specifically, the trace R1 in the embodiment includes at least one high-speed differential pair trace and a plurality of ground traces. As shown in FIG. 2, five high-speed differential pair traces and a plurality of ground traces are illustrated for exemplary purpose, but not limited thereto. A portion of FIG. 2 is enlarged for exemplary purpose and described in details. In the trace R1, the high-speed differential pair traces ($S_{1a}/S_{1b}$, $S_{2a}/S_{2b}$, ... ) are located on the ground traces ($G_1$, $G_2$, $G_3$, ... ) and closely adjacent to each other, that is, they are arranged in an interval sequence (i.e., in the sequence of $G_1S_{1a}S_{1b}G_2S_{2a}S_{2b}G_3$ ... ), such that two opposite sides of each high-speed differential pair traces ($S_{1a}/S_{1b}$, $S_{2a}/S_{2b}$, ... ) line are provided with ground ($G_1$, $G_2$, $G_3$, ... ) line.

Herein, the concept of "closely adjacent" is as shown in FIG. 2 and FIG. 3. In trace R1, there is no other trace between any high-speed differential pair traces ($S_{1a}/S_{1b}$, $S_{2a}/S_{2b}$, ... ), and there is no other trace between any one of the high-speed differential pair traces ($S_{1a}/S_{1b}$, $S_{2a}/S_{2b}$, ... ) and the ground traces ($G_1$, $G_2$, $G_3$, ... ) adjacent thereto. In other words, in the trace R1, the arrangement in interval sequence is the only arrangement.

It should be pointed out that the dielectric substrate 114 of the circuit board structure 100 in the embodiment further has a plurality of vias 114a configured to pass through and connect the surfaces S1 and S2, and the vias 114a are located on the ground traces ($G_1$, $G_2$, $G_3$, ... ) of the trace R1, and the circuit board structure 100 further includes a plurality of fourth conductor layers 113 disposed on the inner wall of the vias 114a, allowing the ground traces ($G_1$, $G_2$, $G_3$, ... ) to electrically conduct the second conductor layer 112 through the fourth conductor layer 113. In this manner, the vias 114a provided with the fourth conductor layer 113 can form a grid structure having a shielding effect on two opposite sides of any one of the high-speed differential pair traces, thereby further providing a shielding effect to the high-speed differential pair traces ($S_{1a}/S_{1b}$, $S_{2a}/S_{2b}$, ... ) sandwiched therebetween. The disclosure provides no limitation to the configuration density of the grid structure. In the embodiment, a distance d1 between adjacent vias on the same ground is smaller than or equal to 4 mm, thereby optimizing the shielding effect provided for the high-speed differential pair traces ($S_{1a}/S_{1b}$, $S_{2a}/S_{2b}$, ... ). Additionally, the ground traces ($G_1$, $G_2$, $G_3$, ... ) of the trace R1 may also be electrically connected to the second conductor layer 112 to achieve a common-grounding effect (having consistency).

On the other hand, the embodiment provides related simulation of a high-speed signal at a frequency of 20 GHz. On a transmission path having a length of 10 inch, a trace width of the high-speed differential pair trace ($S_{1a}/S_{1b}$, $S_{2a}/S_{2b}$, ... ) is correspondingly set as larger than or equal to 3.5 mil, a thickness of the dielectric substrate 114 is larger than or equal to 3 mil, and a thickness of the insulating layer 115 is larger than or equal to 3 mil. Along with the configuration of the vias 114a, the obtained attenuation or insertion loss of 10 GHz is about 5.6 dB, such that the circuit board structure 100 of the embodiment can successfully achieve attenuation within 6 dB.

Additionally, referring to FIG. 2, the traces R2 and R3 on the circuit board structure 100 are respectively non-high-speed signals such that the attenuation of the circuit board structure 100 can be reduced in high-speed transmission. Therefore, the circuit board structure 100 in the embodiment sets the traces R2 and R3 which are non-high-speed signals around the connectors 120A and 120B and electrically connected between the connectors 120A and 120B. In other words, the circuit board structure 100 in the embodiment connects the trace R1 having high-speed differential pair traces ($S_{1a}/S_{1b}$, $S_{2a}/S_{2b}$, ... ) between the connectors 120A and 120B through the shortest path between the connectors 120A and 120B, that is, the straight line path between the connectors 120A and 120B shown in FIG. 2, thereby avoiding attenuation or insertion loss and improving transmission efficiency. In another embodiment that is not shown, when the circuit board structure is a multi-layer printed circuit board, the traces R2 and R3 which are non-high-speed signals may be alternatively disposed on an upper circuit board or a lower circuit board of the trace R1 having high-speed differential pair traces, that is, to allow the traces R2 and R3 which are non-high-speed differential pair traces to be located above or under the trace R1 which is a high-speed differential pair trace, or allow the trace R1 which is a high-speed differential pair trace to be located between the traces R2 and R3 which are non-high-speed differential pair traces, rather than the configuration of encircling path as mentioned above.

In summary, in the embodiments of the disclosure, the circuit board structure is disposed on the upper and lower sides of the first conductor layer through the second conductor layer and the third conductor layer. Meanwhile, the distance between the third conductor layer and the first conductor layer is increased due to the thickness of the insulating layer, thereby providing a sufficient shielding effect to the first conductor layer formed with traces, such that signal interference can be avoided and transmission efficiency can be enhanced.

Further, traces are disposed through the shortest path between connectors, and the two opposite sides of the high-speed differential pair trace in the traces are grounded and arranged in an interval sequence, and overlapped with the via of the dielectric substrate through grounding, the inner wall of the via is further provided with the fourth conductor layer to be electrically connected between the ground and the second conductor layer. In this manner, the grid structure can be formed on both sides of the high-speed differential pair trace and further cooperates with the second conductor layer and the third conductor layer to effectively gain the shielding effect for the high-speed differential pair trace, thereby reducing attenuation or insertion loss of high-speed signal.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A circuit board structure, comprising:
    a dielectric substrate, having a plurality of vias;
    a first conductor layer and a second conductor layer, respectively disposed on two opposite surfaces of the dielectric substrate, wherein the first conductor layer forms a plurality of traces comprising at least one pair of signal traces and a plurality of ground traces, and the vias are located on the ground traces;
    an insulating layer, disposed on the dielectric substrate and covering the first conductor layer;
    a third conductor layer, disposed on the insulating layer, wherein the third conductor layer is insulated from the first conductor layer; and
    a pair of connectors, the traces electrically connected between the pair of connectors,
    wherein the traces comprise a plurality of pair of signal traces, and each pair of signal traces is connected between the pair of connectors through a shortest path between the pair of connectors to constitutes a high-speed differential pair trace, the traces further comprise at least one non-high-speed differential pair trace disposed to surround the pair of connectors and electrically connected to the pair of connectors.

2. The circuit board structure according to claim 1, wherein the at least one pair of signal traces constitutes a high-speed differential pair trace which is located between the two adjacent ground traces and closely adjacent to each other.

3. The circuit board structure according to claim 1, wherein the traces comprise a plurality of pair of signal traces, the plurality of pair of signal traces constitute a plurality of high-speed differential pair traces, and the high-speed differential pair traces and the ground traces are arranged in an interval sequence.

4. The circuit board structure according to claim 1, further comprising:
    a plurality of fourth conductor layers, disposed on an inner wall of the vias, the ground traces electrically conducting the second conductor layer through the fourth conductor layers.

5. The circuit board structure according to claim 1, wherein on the same ground trace, a distance between the adjacent vias is smaller than or equal to 4 mm.

6. The circuit board structure according to claim 1, wherein in the pair of signal traces which are a high-speed differential pair trace, a trace width of each of the high-speed differential pair traces is larger than or equal to 3.5mil.

7. The circuit board structure according to claim 1, wherein a thickness of the dielectric substrate is larger than or equal to 3mil, and a thickness of the insulating layer is larger than or equal to 3 mil.

* * * * *